(12) United States Patent
Ko et al.

(10) Patent No.: US 11,211,273 B2
(45) Date of Patent: Dec. 28, 2021

(54) CARRIER SUBSTRATE AND PACKAGING METHOD USING THE SAME

(71) Applicant: SAMSUNG ELECTRONICS CO., LTD., Suwon-si (KR)

(72) Inventors: Ji-Han Ko, Hwaseong-si (KR); Wonkeun Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 47 days.

(21) Appl. No.: 16/424,834

(22) Filed: May 29, 2019

(65) Prior Publication Data

US 2020/0135498 A1 Apr. 30, 2020

(30) Foreign Application Priority Data

Oct. 24, 2018 (KR) .................. 10-2018-0127159

(51) Int. Cl.
| | |
|---|---|
| *H01L 21/673* | (2006.01) |
| *H01L 21/50* | (2006.01) |
| *C03C 27/06* | (2006.01) |
| *B32B 17/06* | (2006.01) |
| *H01L 23/00* | (2006.01) |

(52) U.S. Cl.
CPC .......... *H01L 21/673* (2013.01); *B32B 17/06* (2013.01); *C03C 27/06* (2013.01); *H01L 21/50* (2013.01); *H01L 24/94* (2013.01)

(58) Field of Classification Search
CPC ....... H01L 21/673; H01L 21/50; H01L 24/94; B32B 17/06
USPC ........................................... 438/94
See application file for complete search history.

(56) References Cited

U.S. PATENT DOCUMENTS

| | | | |
|---|---|---|---|
| 9,533,484 B2 | 1/2017 | Canale et al. | |
| 9,899,337 B2 | 2/2018 | Chang et al. | |
| 9,947,554 B2 | 4/2018 | Choi et al. | |
| 2013/0250520 A1* | 9/2013 | Taniguchi | F28F 21/089 361/707 |
| 2014/0127857 A1 | 5/2014 | Chen et al. | |
| 2016/0133486 A1 | 5/2016 | Andry et al. | |
| 2016/0167359 A1* | 6/2016 | Canale | H01L 21/6838 156/752 |

FOREIGN PATENT DOCUMENTS

| | | |
|---|---|---|
| JP | 2012-216824 A | 11/2012 |
| KR | 10-1015762 B1 | 1/2011 |

\* cited by examiner

*Primary Examiner* — Elias Ullah
(74) *Attorney, Agent, or Firm* — Lee IP Law, P.C.

(57) ABSTRACT

A carrier substrate and a packaging method, the carrier substrate including a first layer; a second layer; and a first glue layer between the first layer and the second layer, wherein the first glue layer is removably attached to the first layer.

11 Claims, 9 Drawing Sheets

CARRIER SUBSTRATE AND PACKAGING METHOD USING THE SAME

CROSS-REFERENCE TO RELATED APPLICATION

Korean Patent Application No. 10-2018-0127159 filed on Oct. 24, 2018 in the Korean Intellectual Property Office, and entitled: "Carrier Substrate and Packaging Method Using the Same," is incorporated by reference herein in its entirety.

BACKGROUND

1. Field

Embodiments relate to a carrier substrate and a packaging method using the same.

2. Description of the Related Art

A semiconductor package may be provided to implement an integrated circuit chip to qualify for use in electronic products. A semiconductor package may be configured such that a semiconductor chip is mounted on a printed circuit board (PCB) and bonding wires or bumps may be used to electrically connect the semiconductor chip to the printed circuit board.

A semiconductor packaging process may proceed in several steps. In some steps, a component may be heated. The heated component may be cooled down again. The semiconductor packaging process may be performed on a carrier substrate.

SUMMARY

The embodiments may be realized by providing a carrier substrate including a first layer; a second layer; and a first glue layer between the first layer and the second layer, wherein the first glue layer is removably attached to the first layer.

The embodiments may be realized by providing a packaging method including preparing a carrier substrate such that the carrier substrate includes a first layer and a second layer on the first layer; performing a first process on the carrier substrate; and removing the second layer from the first layer.

The embodiments may be realized by providing a packaging method including preparing a carrier substrate such that the carrier substrate includes a first layer; performing a first process on the carrier substrate; and adding a second layer onto the first layer.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
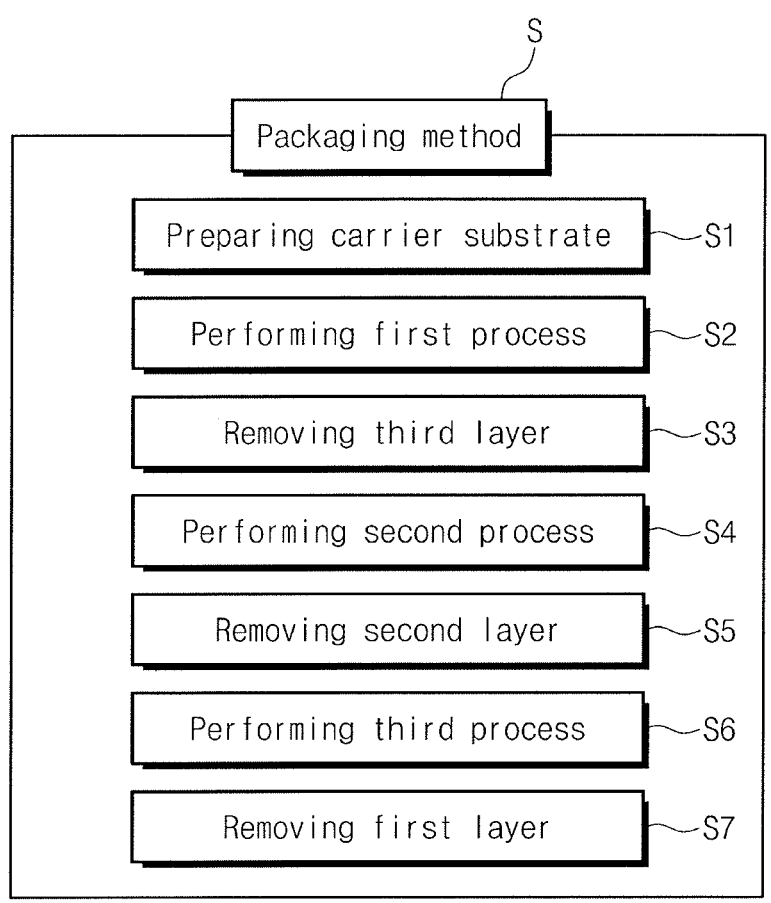
FIG. 1 illustrates a flow chart of a packaging method using a carrier substrate according to some example embodiments.

FIG. 1 illustrates a flow chart of a packaging method using a carrier substrate according to some example embodiments.

Referring to FIG. 1, a semiconductor packaging method S may include a step S1 of preparing a carrier substrate, a step S2 of performing a first process, a step S3 of removing a third layer, a step S4 of performing a second process, a step S5 of removing a second layer, a step S6 of performing a third process, and a step S7 of removing a first layer.

Figure 2:
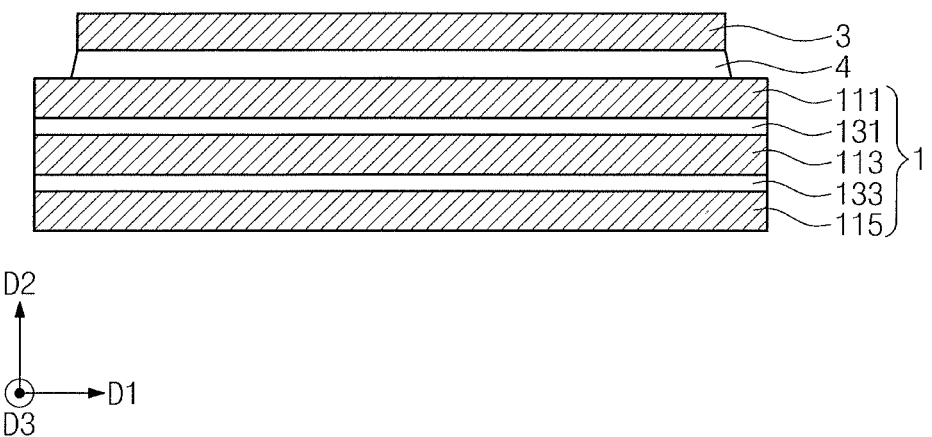
FIG. 2 illustrates a cross-sectional view of a step of preparing a carrier substrate in the packaging method of FIG. 1 using a carrier substrate according to some example embodiments.

FIG. 2 illustrates a cross-sectional view of the step S1 of preparing a carrier substrate according to the flow chart of FIG. 1.

In FIG. 2 and other drawings, a rightward direction may be called a first direction D1, an upward direction may be called a second direction D2, and a frontward direction may be called a third direction D3 (perpendicular to the first and second directions D1 and D2). The first direction D1 may also be called a right side, the second direction D2 may also be called an upside side, the third direction D3 may also be called a front side, and a direction opposite to the second direction D2 may be called a downward side.

Referring to FIG. 2, a carrier substrate 1 may be provided in the step S1. The carrier substrate 1 may be provided thereon with a substrate 3 (e.g., buffer) on which a semiconductor chip (see 5 of FIG. 3A) will be stacked. The substrate 3 may be or include a printed circuit board (PCB)

or the like. The substrate 3 may include, e.g., other suitable components on which a semiconductor chip 5 will be stacked. In an implementation, a semiconductor chip 5 may be stacked on the carrier substrate 1 on which the substrate 3 is not provided.

In an implementation, an adhesive layer 4 may further be provided between the carrier substrate 1 and the substrate 3. The adhesive layer 4 may rigidly place or attach the substrate 3 on the carrier substrate 1. In an implementation, the substrate 3 may be directly placed on the carrier substrate 1 without the adhesive layer 4 therebetween.

The carrier substrate 1 may have a multi-layered structure. In an implementation, the carrier substrate 1 may include a first layer 111, a second layer 113, a third layer 115, a first glue layer 131, and a second glue layer 133.

The first layer 111 may be provided on the second layer 113. The second layer 113 may be provided on the third layer 115. For example, the first, second, and third layers 111, 113, and 115 may be disposed in the foregoing sequence along a downward direction. In an implementation, as illustrated in FIG. 2, three layers 111, 113, and 115 may be provided. In an implementation, only two layers may be provided. In an implementation, four or more layers may be provided.

The first layer 111 may have a coefficient of thermal expansion (CTE) that is greater than that of the second layer 113. The coefficient of thermal expansion of the second layer 113 may be greater than that of the third layer 115. For example, the coefficient of thermal expansion may become smaller in the order of the first, second, and third layers 111, 113, and 115.

In an implementation, the first, second, and third layers 111, 113, and 115 may include glass. In an implementation, the first layer 111 may include metal, and the second and third layers 113 and 115 may include glass. Metal may have a coefficient of thermal expansion greater than that of glass. In an implementation, the first layer 111 may include an organic material, the second layer 113 may include metal, and the third layer 115 may include glass. An organic material may have a coefficient of thermal expansion greater than that of metal. In an implementation, the first, second, and third layers 111, 113, and 115 may include other suitable materials whose coefficients of thermal expansion become smaller in the order of the first, second, and third layers 111, 113, and 115.

The first glue layer 131 may be provided on the second layer 113. The first glue layer 131 may be between the first layer 111 and the second layer 113. The first glue layer 131 may couple the first layer 111 to the second layer 113. The first glue layer 131 may include, e.g., silicone, epoxy, acryl, resin, or the like. The first glue layer 131 may be removably attached to the first layer 111. For example, a variety of physical and/or chemical methods may be used to separate and remove the first glue layer 131 from the first layer 111. A detailed description thereof will be further discussed below.

The second glue layer 133 may be provided on the third layer 115. The second glue layer 133 may be between the second layer 113 and the third layer 115. The second glue layer 133 may couple the second layer 113 to the third layer 115. The second glue layer 133 may include, e.g., silicone, epoxy, acryl, resin, or the like. The second glue layer 133 may be removably attached to the second layer 113. For example, the second glue layer 133 may be variously physically and/or chemically separated and removed from the second layer 113. A detailed description thereof will be further discussed below.

Figure 3A:
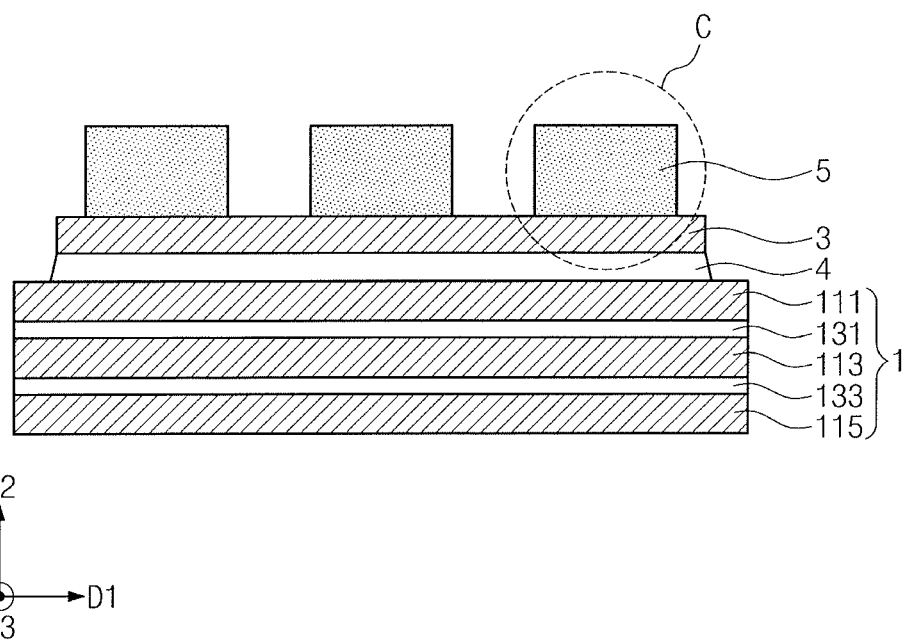
FIG. 3A illustrates a cross-sectional view of a step of performing a first process in the packaging method of FIG. 1 using a carrier substrate according to some example embodiments.

FIG. 3A illustrates a cross-sectional view of the step S2 of performing a first process according to the flow chart of FIG. 1.

Referring to FIG. 3A, a first process may be performed in the step S2. The first process may be carried out on the carrier substrate 1. The first process may include heating and/or cooling the carrier substrate 1 and/or components on the carrier substrate 1. The first process may raise or lower temperature of the carrier substrate 1 and/or components on the carrier substrate 1.

The first process may include stacking the semiconductor chip 5. The semiconductor chip 5 may include a logic chip and/or a memory chip. The semiconductor chip 5 may be stacked on the substrate 3 and/or the carrier substrate 1. The first process may further include heating or cooling the stacked semiconductor chip 5. For example, after the semiconductor chip 5 is stacked, the semiconductor chip 5 may be heated. The heated semiconductor chip 5 may be cooled back down.

Figures 3B, 3C:
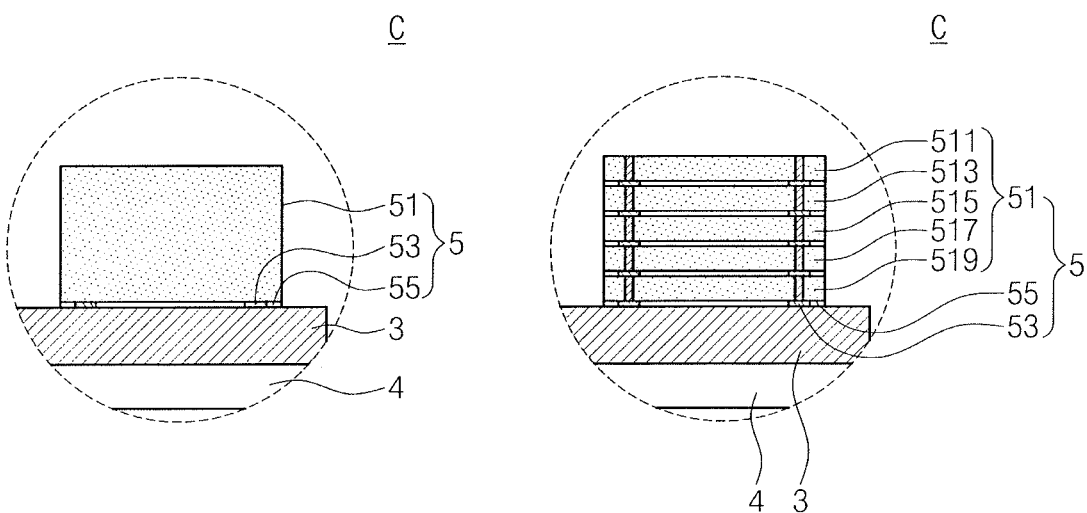
FIG. 3B illustrates an enlarged cross-sectional view showing section C of FIG. 3A.
FIG. 3C illustrates an enlarged cross-sectional view showing section C of FIG. 3A.

FIG. 3B illustrates an enlarged cross-sectional view showing section C of FIG. 3A.

Referring to FIG. 3B, the semiconductor chip 5 may include a single die or chip 51. The chip 51 and the substrate 3 may be electrically connected to each other through one or more conductive terminals 53. The chip 51 may be adhered through an adhesive pattern 55 to the substrate 3. The adhesive pattern 55 may surround the conductive terminal 53. The adhesive pattern 55 may include a dielectric material. The adhesive pattern 55 may include polymer, resin, or the like.

FIG. 3C illustrates an enlarged cross-sectional view of section C of FIG. 3A.

Referring to FIG. 3C, the semiconductor chip 5 may include a chip 51 that includes two or more chips 511, 513, 515, 517, and 519 that are stacked in the second direction D2. The chips 511, 513, 515, 517, and 519 stacked in the second direction D2 may be electrically connected to the substrate 3 via through electrodes and conductive terminals 53. In an implementation, the chips 511, 513, 515, 517, and 519 may be electrically wire-bonded to the substrate 3. Adhesive patterns 55 may be provided between the chips 511, 513, 515, 517, and 519. The adhesive patterns 55 may couple the chips 511, 513, 515, 517, and 519 to each other, and/or may couple a lowermost chip 511 to the substrate 3.

Referring back to FIG. 3A, a plurality of the semiconductor chips 5 may be provided in the first direction D1. The plurality of semiconductor chips 5 may be arranged and spaced apart from each other in the first direction D1. In an implementation, three semiconductor chips 5 may be spaced apart from each other in the first direction D1. In an implementation, more than one semiconductor chip 5 may be disposed in the first direction D1.

When one or more of the semiconductor chips 5 are on the carrier substrate 1 and/or the substrate 3, the carrier substrate 1 and/or its overlying components may be heated. For example, the adhesive patterns 55 may be heated and cured to bond the semiconductor chips 5. In an implementation, the adhesive patterns 55 may be heated and melted to bond the semiconductor chips 5. In an implementation, the carrier substrate 1 and/or its overlying components may be heated for other purposes. The carrier substrate 1 and/or one or more of its overlying components may be heated and expanded.

Heat may be removed from the carrier substrate 1 and/or its overlying components. The carrier substrate 1 and/or one or more of its overlying components may be cooled and contracted.

In an implementation, the first process may be performed in such a way that one or more semiconductor chips 5 are stacked, heated, and/or cooled. For example, the first process may include a suitable process including heating and/or cooling the carrier substrate 1 and/or its overlying components.

The carrier substrate 1 may have a coefficient of thermal expansion that is different from those of its overlying components. For example, the coefficient of thermal expansion of the carrier substrate 1 may be less than that of the adhesive pattern 55.

Figure 4:
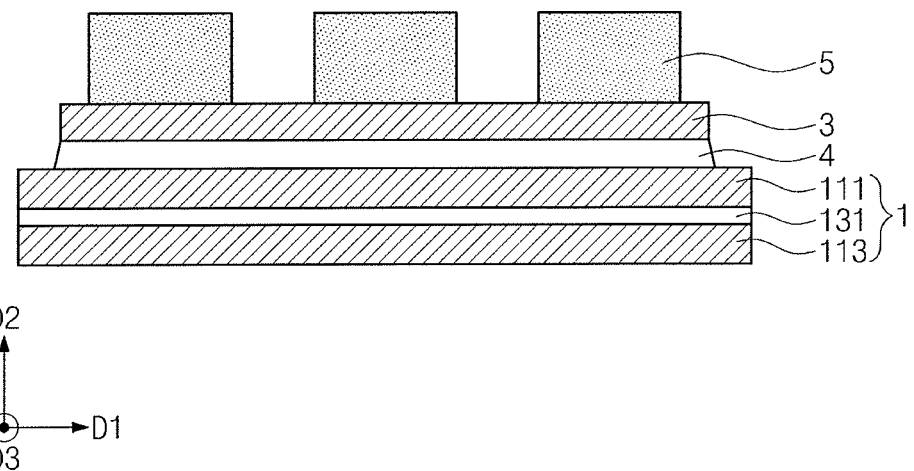
FIG. 4 illustrates a cross-sectional view of a step of removing a third layer in the packaging method of FIG. 1 using a carrier substrate according to some example embodiments.

FIG. 4 illustrates a cross-sectional view of the step S3 of removing a third layer according to the flow chart of FIG. 2.

Referring to FIG. 4, the third layer (see 115 of FIG. 3A) may be removed in the step S3. The third layer 115 may be separated from the first and second layers 111 and 113, and removed from the carrier substrate 1.

The third layer 115 may be attached through the second glue layer 133 to a bottom of the second layer 113, and then may be removed along with the second glue layer 133. A variety of suitable methods may be used to separate the second glue layer 133 from the second layer 113. The second glue layer 133 may be physically and/or chemically separated from the second layer 113. In an implementation, a laser may be employed to separate the second glue layer 133 from the second layer 113. In an implementation, a physical impact may be utilized to separate the second glue layer 133 from the second layer 113. In this case, the physical impact may generate cracks between the second glue layer 133 and the second layer 113, and these cracks may cause the removal of the second glue layer 133 from the second layer 113. In an implementation, other suitable methods may be executed to separate the second glue layer 133 from the second layer 113.

In an implementation, the third layer 115 may be attached to the second layer 113 without the second glue layer 133 therebetween, and then may be removed from the second layer 113. A variety of suitable methods may be performed to remove the third layer 115. For example, a variety of physical and/or chemical methods may be used to separate the third layer 115 from the second layer 113.

The removed third layer 115 may have a coefficient of thermal expansion that is less than that of the first layer 111 and/or that of the second layer 113. The carrier substrate 1 from which the third layer 115 has been removed may have a coefficient of thermal expansion that is greater than that of the carrier substrate 1 that still includes the third layer 115. For example, the coefficient of thermal expansion of the carrier substrate 1 from which the third layer 115 has been removed may be changed to approach those of components on the carrier substrate 1. A thickness and coefficient of thermal expansion of the third layer 115 that will be removed may be appropriately selected in consideration of coefficients of thermal expansion of components on the carrier substrate 1.

The carrier substrate 1 from which the third layer 115 has been removed may have a neutral axis that moves upwards. For example, a whole structure including the carrier substrate 1 and the semiconductor chip 5 coupled thereto may have a neutral axis that also moves upwards. In an implementation, a neutral axis may be an axis along which there is no stress when a bending moment is exerted. When a neutral axis moves upwards, a difference in coefficient of thermal expansion may be reduced between components above the neutral axis and components below the neutral axis. Warpage of the carrier substrate 1 and its overlying components may be reduced or prevented. The carrier substrate 1 and its overlying components may preserve their functions.

In an implementation, the removed third layer 115 may be thrown away. In an implementation, the removed third layer 115 may be reserved and recycled in other processes.

Figure 5:
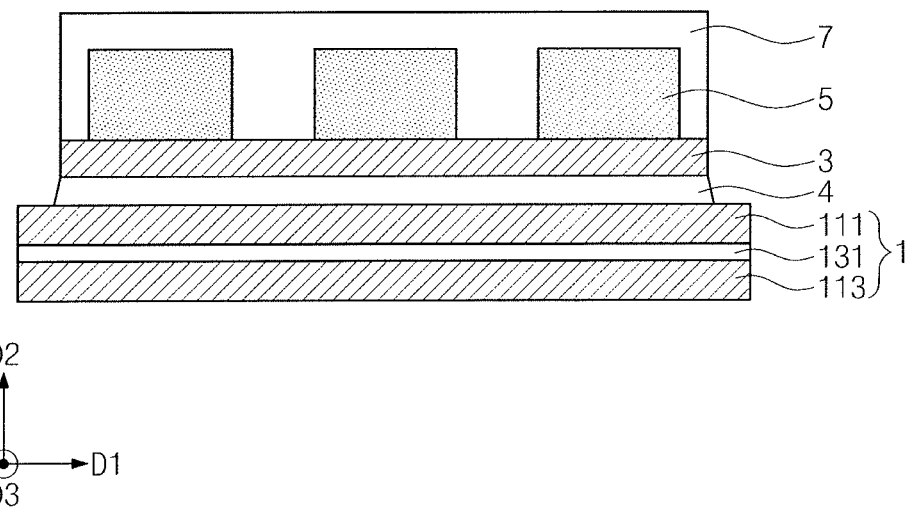
FIG. 5 illustrates a cross-sectional view of a step of performing a second process in the packaging method of FIG. 1 using a carrier substrate according to some example embodiments.

FIG. 5 illustrates a cross-sectional view of the step S4 of performing a second process according to the flow chart of FIG. 2.

Referring to FIG. 5, a second process may be performed in the step S4. The second process may be carried out on the carrier substrate 1. The second process may include heating and/or cooling the carrier substrate 1 and/or its overlying components. The second process may raise or lower temperature of the carrier substrate 1 and/or its overlying components.

The second process may include a molding process. The molding process may form a molding layer 7 to encapsulate the stacked semiconductor chip 5. A mold frame or the like may be used to perform the molding process.

The molding layer 7 may help protect the encapsulated semiconductor chip 5 from external environment. The molding layer 7 may help protect the semiconductor chips 5 against external heat, moisture, impact, or the like. The molding layer 7 may outwardly discharge heat generated from the semiconductor chip 5 and/or the substrate 3. In an implementation, the molding layer 7 may include, e.g., an epoxy molding compound (EMC). In an implementation, the molding layer 7 may include other dielectric materials.

The carrier substrate 1 and/or its overlying components may be provided with heat to form the molding layer 7. The carrier substrate 1 and/or one or more of its overlying components may be heated and expanded. In order to form the molding layer 7, heat may be removed from the carrier substrate 1 and/or its overlying components. The carrier substrate 1 and/or one or more of its overlying components may be cooled and contracted.

In an implementation, the second process may be performed in such a way that the carrier substrate 1 and its overlying components are heated and/or cooled to form the molding layer 7. In an implementation, the second process may include a suitable process including heating and/or cooling the carrier substrate 1 and/or its overlying components.

The carrier substrate 1 may have a coefficient of thermal expansion that is different from those of components on the carrier substrate 1. The coefficient of thermal expansion of the carrier substrate 1 may be less than that of the adhesive pattern (see 55 of FIG. 3A or 3B) and that of the molding layer 7. In an implementation, the coefficient of the molding layer 7 may be greater than that of the adhesive pattern 55, and the coefficient of the adhesive pattern 55 may be greater than that of the carrier substrate 1. For example, components on the carrier substrate 1 may have their coefficients of thermal expansion greater than that of the carrier substrate 1.

Figure 6:
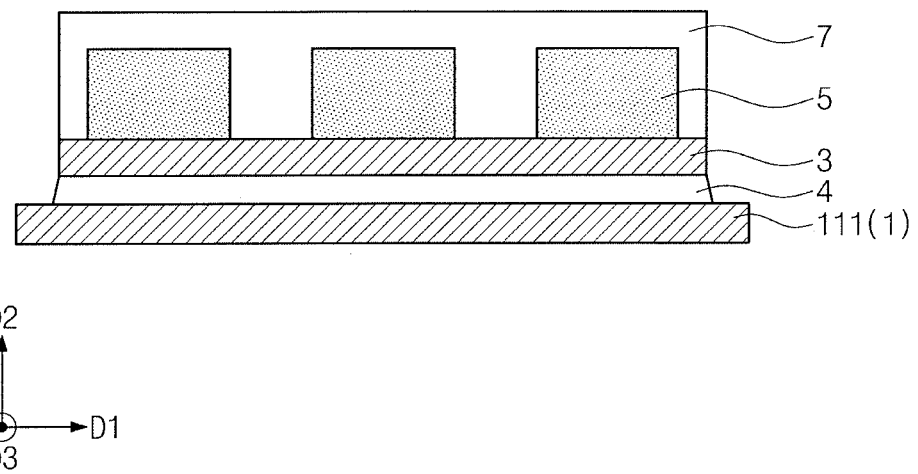
FIG. 6 illustrates a cross-sectional view of a step of removing a second layer in a packaging method illustrated in FIG. 1 using a carrier substrate according to some example embodiments.

FIG. 6 illustrates a cross-sectional view of the step S5 of removing a second layer according to the flow chart of FIG. 2.

Referring to FIG. 6, the second layer (see 113 of FIG. 5) may be removed in the step S5. The second layer 113 may be separated from the first layer 111 and thus may be removed from the carrier substrate 1.

The second layer 113 may be attached through the first glue layer 131 to a bottom of the first layer 111, and then may be removed with the first glue layer 131. A variety of suitable methods may be used to separate the first glue layer 131 from the first layer 111. The first glue layer 131 may be physically and/or chemically separated from the first layer 111. In an implementation, a laser may be employed to separate the first glue layer 131 from the first layer 111. In an implementation, a physical impact may be utilized to separate the first glue layer 131 from the first layer 111. In this case, the physical impact may generate cracks between the first glue layer 131 and the first layer 111, and these cracks may cause the removal of the first glue layer 131 from the first layer 111. In an implementation, other suitable methods may be executed to separate the first glue layer 131 from the first layer 111.

The second layer 113 may be attached to the first layer 111 without the first glue layer 131 therebetween and may be removed from the first layer 111. A variety of suitable methods may be performed to remove the second layer 113. For example, a variety of physical and/or chemical methods may be used to separate the second layer 113 from the first layer 111.

The removed second layer 113 may have a coefficient of thermal expansion that is less than that of the first layer 111. The carrier substrate 1 from which the second layer 113 has been removed may have a coefficient of thermal expansion that is greater than that of the carrier substrate 1 that still includes the second layer 113. For example, the coefficient of thermal expansion of the carrier substrate 1 from which the second layer 113 has been removed may be changed to approach those of components on the carrier substrate 1. A thickness and coefficient of thermal expansion of the second layer 113 that will be removed may be appropriately selected in consideration of coefficients of thermal expansion of components on the carrier substrate 1.

The carrier substrate 1 from which the second layer 113 has been removed may have a neutral axis that moves upwards. Thus, a whole structure including the carrier substrate 1 and the semiconductor chip 5 coupled thereto may have a neutral axis that also moves upwards. When a neutral axis moves upwards, a difference in coefficient of thermal expansion may be reduced between components above the neutral axis and components below the neutral axis. Warpage of the carrier substrate 1 and its overlying components may be reduced or prevented. The carrier substrate 1 and its overlying components may preserve their functions.

In an implementation, the removed second layer 113 may be thrown away. In an implementation, the removed second layer 113 may be reserved and recycled in other processes.

In the step S6, a process may be performed to accomplish a semiconductor package. The carrier substrate 1 and/or its overlying components may be heated and/or cooled.

In the step S7, the first layer 111 may be removed. The first layer 111 may be separated from the substrate 3 and/or the adhesive layer 4 and thus may be removed from the semiconductor package.

In an implementation, the carrier substrate 1 may include three layers 111, 113, and 115. In an implementation, the number of layers that will be removed from the carrier substrate 1 may be variously determined in consideration of coefficients of thermal expansion of components on the carrier substrate 1 and the number of processes.

In the semiconductor packaging method S according to some example embodiments, although the carrier substrate 1 and its overlying components are heated or cooled during a packaging process, warpage of the carrier substrate 1 and/or its overlying components may be prevented.

The carrier substrate 1 may include a material different from those of components on the carrier substrate 1. The carrier substrate 1 may have a coefficient of thermal expansion that is different from those of components on the carrier substrate 1. For example, the coefficients of thermal expansion of components on the carrier substrate 1 may be greater than that of the carrier substrate 1. For example, when heating and/or cooling processes are performed, the carrier substrate 1 and its overlying components may be expanded and/or contracted at different rates. In a case in which the carrier substrate 1 and its overlying components are expanded and/or contracted at different rates, bending may be exerted on a whole structure including the carrier substrate 1 and its overlying components.

In the semiconductor packaging method S according to some example embodiments, when heating and/or cooling is performed, a part or parts constituting the carrier substrate 1 may be removed to change the coefficient of thermal expansion of the carrier substrate 1. For example, the carrier substrate 1 may increase in coefficient of thermal expansion. It may therefore be possible to avoid a great difference in coefficient of thermal expansion between the carrier substrate 1 and its overlying components. The carrier substrate 1 and its overlying components may not be warped. A semiconductor package may decrease in stress. The semiconductor package may preserve its configuration and function. A packaging process may be executed without interruption, and subsequent processes may be carried out. The packaging process may be performed at high speeds. The packaging process may increase in yield. The semiconductor package may cut down process cost.

In the semiconductor packaging method S according to some example embodiments, the carrier substrate 1 may control its coefficient of thermal expansion at every step by removing a material having a different coefficient of thermal expansion, which may result in overcoming the development of raw materials for the carrier substrate 1. The carrier substrate 1 may be formed of various materials. The carrier substrate 1 may reduce the process cost. In addition, it may be possible to freely select materials for a substrate and a molding layer that constitute the semiconductor package. The semiconductor package may be free of limitation in selecting raw materials.

Figure 7:
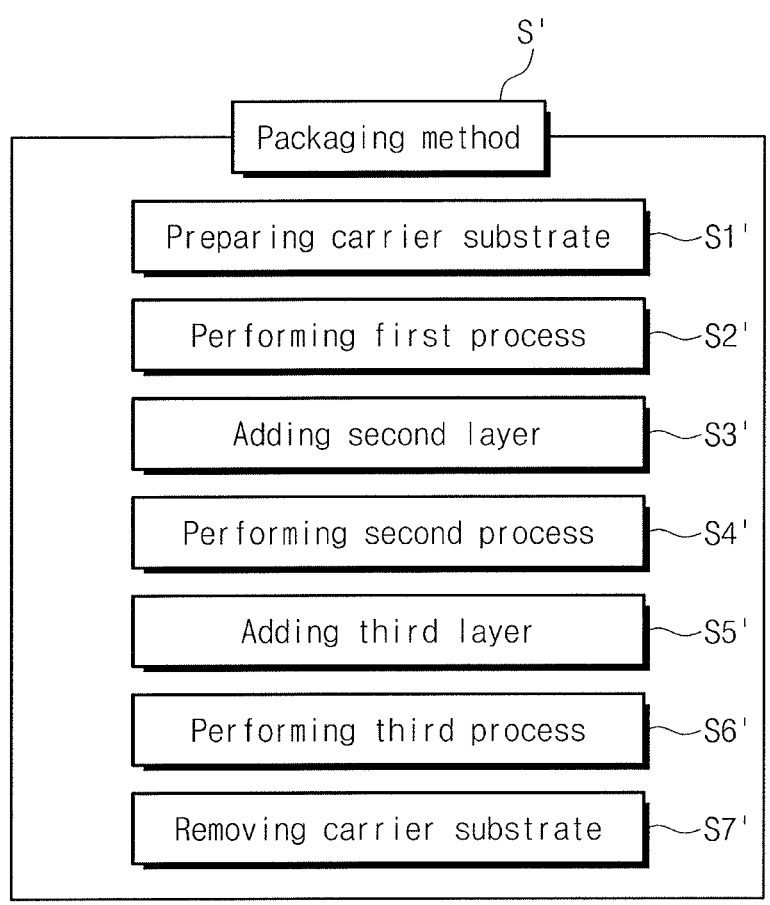
FIG. 7 illustrates a flow chart of a packaging method using a carrier substrate according to some example embodiments.

FIG. 7 illustrates a flow chart of a packaging method using a carrier substrate according to some example embodiments.

In the embodiment that follows, components and/or processes substantially the same as or similar to those discussed above with reference to FIGS. 1 to 6 may be omitted for convenience of description.

Referring to FIG. 7, a semiconductor packaging method S' may include a step S1' of preparing a carrier substrate, a step S2' of performing a first process, a step S3' of adding a second layer, a step S4' of performing a second process, a step S5' of adding a third layer, a step S6' of performing a third process, and a step S7' of removing a carrier substrate.

Figure 8:
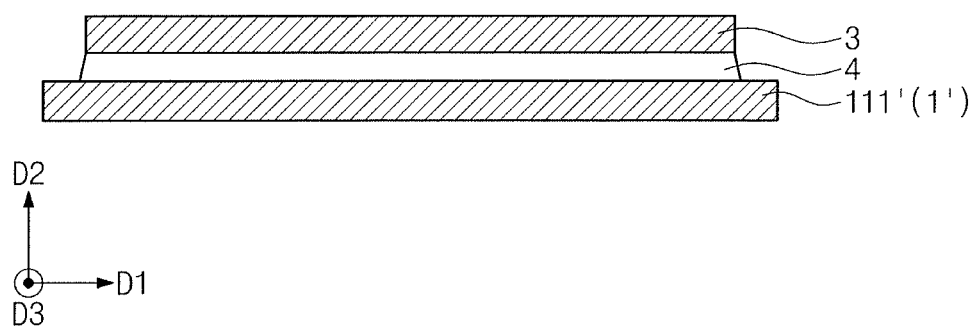
FIG. 8 illustrates a cross-sectional view of a step of preparing a carrier substrate in the packaging method of FIG. 7 using a carrier substrate according to some example embodiments.

FIG. 8 illustrates a cross-sectional view of the step S1' of preparing a carrier substrate according to the flow chart of FIG. 7.

Referring to FIG. 8, a carrier substrate 1' may be provided in the step S1'. The carrier substrate 1' may be provided thereon with a substrate 3 on which a semiconductor chip (see 5 of FIG. 9) is stacked. In an implementation, an adhesive layer 4 may further be provided between the carrier substrate 1' and the substrate 3. In an implementation, the substrate 3 may be placed on the carrier substrate 1' without the adhesive layer 4 therebetween. Dissimilarly, a semiconductor chip (see 5 of FIG. 9) may be directly stacked on the carrier substrate 1' on which the substrate 3 is not provided.

The carrier substrate 1' provided in the step S1' may have a single-layered structure. The carrier substrate 1' may include a first layer 111'. The first layer 111' may include glass or the like.

Figure 9:
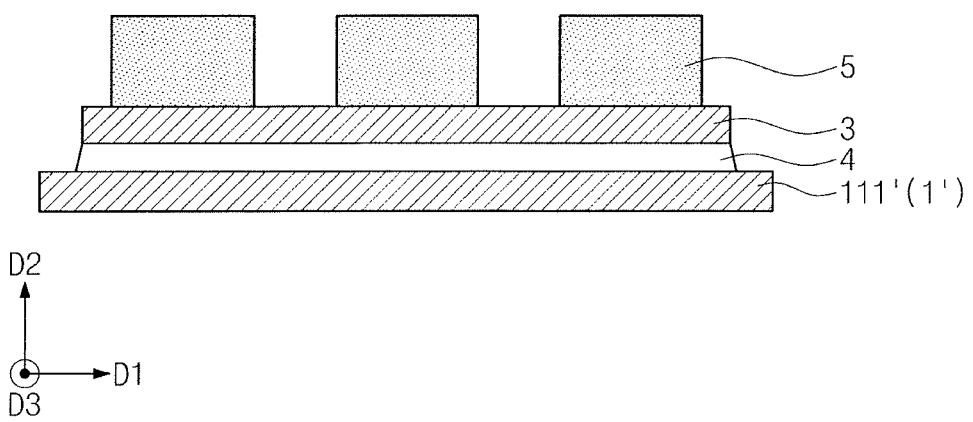
FIG. 9 illustrates a cross-sectional view showing a step of performing a first process in the packaging method of FIG. 7 using a carrier substrate according to some example embodiments.

FIG. 9 illustrates a cross-sectional view showing the step S2' of performing a first process according to the flow chart of FIG. 7.

Referring to FIG. 9, a first process may be performed in the step S2'. The first process may be carried out on the carrier substrate 1'. The first process may include heating and/or cooling the carrier substrate 1' and/or components on the carrier substrate 1'. The first process may raise or lower temperature of the carrier substrate 1' and/or its overlying components.

The first process may include stacking one or more semiconductor chips 5. The stacking of the semiconductor chip 5 may be substantially the same as or similar to that discussed above with reference to FIG. 3A.

In an implementation, the first process may be performed in such a way that one or more semiconductor chips 5 are stacked, heated, and/or cooled. For example, the first process may include any process including heating and/or cooling the carrier substrate 1' and/or its overlying components. The first layer 111' may have a coefficient of thermal expansion that is different from those of components on the first layer 111'. For example, the coefficient of thermal expansion of the first layer 111' may be less than those of components on the first layer 111'.

Figure 10:
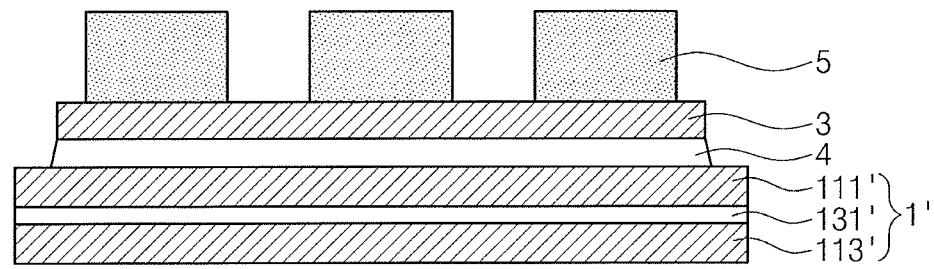
FIG. 10 illustrates a cross-sectional view of a step of adding a second layer in the packaging method of FIG. 7 using a carrier substrate according to some example embodiments.
Figure 10:
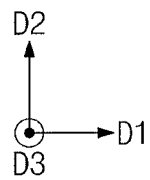

FIG. 10 illustrates a cross-sectional view showing the step S3' of adding a second layer according to the flow chart of FIG. 7.

Referring to FIG. 10, in the step S3', a second layer 113' may be added onto, e.g., below, the first layer 111'. In an implementation, the second layer 113' may be directly coupled to a bottom of the first layer 111' (e.g., a side of the first layer 111' that faces away from the semiconductor chips 5). In an implementation, a first glue layer 131' may be coupled to the bottom of the first layer 111', and the second layer 113' may be coupled through the first glue layer 131' to the first layer 111'. The first glue layer 131' may be configured substantially identically or similarly to the first glue layer 131 discussed above with reference to FIG. 2.

The added second layer 113' may have a coefficient of thermal expansion that is greater than that of the first layer 111'. The coefficient of thermal expansion may become greater in the order of the first and second layers 111' and 113' (e.g., below or at a bottom side of the carrier substrate 1'). The carrier substrate 1' to which the second layer 113' has been added may have a coefficient of thermal expansion that is greater than that of the carrier substrate 1' prior to the addition of the second layer 113'. Therefore, the coefficient of thermal expansion of the carrier substrate 1' to which the second layer 113' has been added may be changed to approach those of components on the carrier substrate 1'. A thickness and coefficient of thermal expansion of the second layer 113' that will be added may be appropriately selected in consideration of coefficients of thermal expansion of components on the carrier substrate 1'.

In an implementation, the second layer 113' may include glass or metal. In an implementation, the second layer 113' may include other suitable materials that cause the second layer 113' to have a coefficient of thermal expansion that is greater than that of the first layer 111'.

Figure 11:
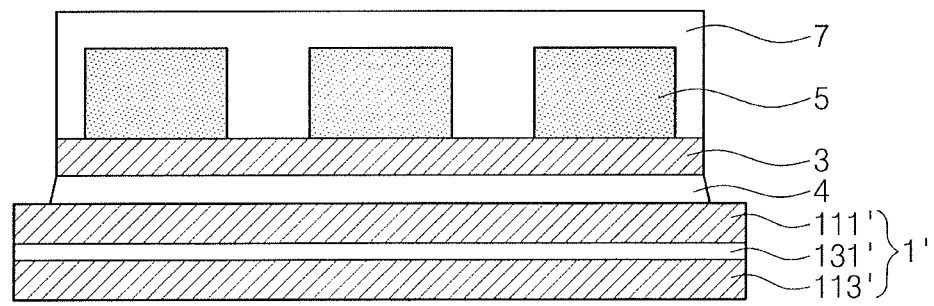
FIG. 11 illustrates a cross-sectional view of a step of performing a second process in the packaging method of FIG. 7 using a carrier substrate according to some example embodiments.
Figure 11:
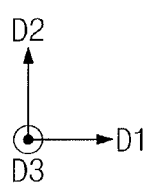

FIG. 11 illustrates a cross-sectional view of the step S4' of performing a second process according to the flow chart of FIG. 7.

Referring to FIG. 11, a second process may be performed in the step S4'. The second process may be carried out on the carrier substrate 1'. The second process may include heating and/or cooling the carrier substrate 1' and/or its overlying components. The second process may raise or lower temperature of the carrier substrate 1' and/or its overlying components.

In an implementation, the second process may include a molding process. The molding process may be substantially the same as or similar to that discussed above with reference to FIG. 5. For example, a molding layer 7 may be formed to encapsulate the semiconductor chip 5.

In an implementation, the second process may be performed in such a way that the carrier substrate 1' and its overlying components are heated and/or cooled to form the molding layer 7. In an implementation, the second process may include a suitable process including heating and/or cooling the carrier substrate 1' and/or its overlying components. The carrier substrate 1' may have a coefficient of thermal expansion that is different from those of components on the carrier substrate 1'. For example, the coefficient of thermal expansion of the carrier substrate 1' may be less than that of the molding layer 7.

Figure 12:
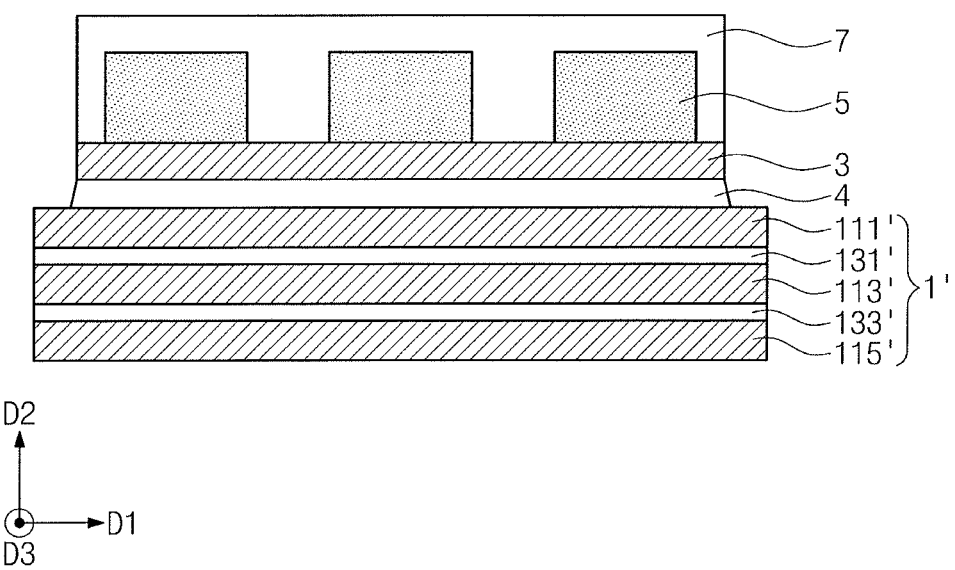
FIG. 12 illustrates a cross-sectional view of a step of adding a third layer in the packaging method of FIG. 7 using a carrier substrate according to some example embodiments.

FIG. 12 illustrates a cross-sectional view of the step S5' of adding a third layer according to the flow chart of FIG. 7.

Referring to FIG. 12, in the step S5', a third layer 115' may be added below the second layer 113' (e.g., on a side of the second layer 113' that faces away from the semiconductor chips 5). In an implementation, the third layer 115' may be directly coupled to a bottom of the second layer 113'. In an implementation, a second glue layer 133' may be coupled to the bottom of the second layer 113', and the third layer 115' may be coupled through the second glue layer 133' to the second layer 113'. The second glue layer 133' may be configured substantially identically or similarly to the second glue layer 133 discussed above with reference to FIG. 2.

The added third layer 115' may have a coefficient of thermal expansion that is greater than that of the second layer 113'. The coefficient of thermal expansion of the second layer 113' may be greater than that of the first layer 111', and the coefficient of thermal expansion of the third layer 115' may be greater than that of the second layer 113'. The coefficient of thermal expansion may become greater in the order of the first, second, and third layers 111', 113', and 115' below (e.g., in a downward direction of) the carrier substrate 1'. The carrier substrate 1' to which the third layer 115' has been added may have a coefficient of thermal expansion that is greater than that of the carrier substrate 1' prior to the addition of the third layer 115'. For example, the coefficient of thermal expansion of the carrier substrate 1' to which the third layer 115' is added may be changed to approach those of components on the carrier substrate 1'. A thickness and coefficient of thermal expansion of the third layer 115' that will be added may be appropriately selected in consideration of coefficients of thermal expansion of components on the carrier substrate 1'.

In an implementation, the third layer 115' may include glass, metal, or an organic material. In an implementation, the third layer 115' may include other suitable materials that cause the third layer 115' to have a coefficient of thermal expansion greater than that of the first layer 111' and/or that of the second layer 113'.

In the step S6', a process may be performed to accomplish a semiconductor package. The carrier substrate 1' and/or its overlying components may be heated and/or cooled.

In the step S7', the carrier substrate 1' may be completely removed. The carrier substrate 1' may be separated from the semiconductor package.

In an implementation, the carrier substrate may include three layers 111', 113', and 115'. In an implementation, the number of layers that will be added to the carrier substrate 1' may be variously determined in consideration of coefficients of thermal expansion of components on the carrier substrate 1' and the number of processes.

In the semiconductor packaging method S' according to some example embodiments, when a packaging process is performed, a part or parts constituting the carrier substrate 1' may be added to change the coefficient of thermal expansion of the carrier substrate 1'. A great difference in coefficient of thermal expansion may be prevented between the carrier substrate 1' and its overlying components. Although the carrier substrate 1' and its overlying components may be heated or cooled, warpage of the carrier substrate 1' and its overlying components may be reduced or prevented. The carrier substrate 1' and its overlying components may not be warped. A semiconductor package may decrease in stress. The semiconductor package may preserve its configuration and function. A packaging process may be executed without interruption, and subsequent processes may be carried out. The packaging process may be performed at high speeds. The packaging process may increase in yield. The semiconductor package may reduce the process cost.

In the semiconductor packaging method S' according to some example embodiments, the carrier substrate 1' may control its coefficient of thermal expansion at every step by adding a material having a different coefficient of thermal expansion, which may result in overcoming the development of raw materials for the carrier substrate 1'. The carrier substrate 1' may be formed of various materials. The carrier substrate 1' may reduce the process cost. In addition, materials may be freely selected to form a substrate and a molding layer that constitute the semiconductor package. The semiconductor package may be free of limitation in selecting raw materials.

According to an embodiment, a difference in coefficient of thermal expansion may be counterbalanced in a carrier substrate and a packaging method using the same.

The occurrence of warpage may be inhibited during a packaging process.

Subsequent processes may be continuously performed during the packaging process, and the packaging process may increase in yield.

It may be possible to overcome limitation in developing raw materials for the carrier substrate.

For example, an overall CTE of the carrier substrate may be adjusted (e.g., increased or decreased) in a stepwise manner in an effort to correspond with the CTE of a chip or other device mounted on the carrier substrate during successive operations that are performed on or to form the chip or other device. Such a correspondence between the CTE of the carrier substrate and the CTE of the chip or other device mounted thereon may help reduce or prevent warpage during packaging of a semiconductor device.

One or more embodiments may provide a carrier substrate capable of counterbalancing a difference in coefficient of thermal expansion and a packaging method using the same.

One or more embodiments may provide a carrier substrate capable of preventing warpage during a packaging process and a packaging method using the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A packaging method, comprising:
   preparing a carrier substrate by attaching a second layer on a first layer such that the carrier substrate includes the first layer and the second layer on the first layer;
   performing a first process on the carrier substrate; and
   completely removing the second layer from the first layer after performing the first process,
   wherein a coefficient of thermal expansion of the second layer is less than a coefficient of thermal expansion of the first layer.

2. The packaging method as claimed in claim 1, wherein performing the first process includes:
   placing a semiconductor chip on the first layer;
   heating the semiconductor chip; and
   cooling the semiconductor chip.

3. The packaging method as claimed in claim 1, wherein preparing the carrier substrate further includes attaching a third layer on the second layer prior to performing the first process and prior to completely removing the second layer such that the second layer is between the first layer and the third layer.

4. The packaging method as claimed in claim 3, further comprising:
   completely removing the third layer from the second layer after performing the first process and prior to completely removing the second layer; and
   performing a second process on the carrier substrate prior to completely removing the second layer.

5. The packaging method as claimed in claim 4, wherein performing the second process includes:
   forming a molding layer covering a semiconductor chip on the first layer; and
   cooling the semiconductor chip and the molding layer.

6. The packaging method as claimed in claim 4, wherein a coefficient of thermal expansion of the third layer is less than the coefficient of thermal expansion of the second layer.

7. A packaging method, comprising:
   preparing a carrier substrate such that the carrier substrate includes a first layer;
   performing a first process on the carrier substrate; and
   adding a second layer onto the first layer after performing the first process,
   wherein a coefficient of thermal expansion of the second layer is greater than a coefficient of thermal expansion of the first layer.

8. The packaging method as claimed in claim 7, wherein performing the first process includes placing and heating a semiconductor chip on the first layer.

9. The packaging method as claimed in claim 7, further comprising:
   performing a second process on the carrier substrate after adding the second layer; and
   adding a third layer onto the second layer after performing the second process.

10. The packaging method as claimed in claim 9, wherein performing the second process includes molding and heating a semiconductor chip on the first layer.

11. The packaging method as claimed in claim 9, wherein a coefficient of thermal expansion of the third layer is greater than the coefficient of thermal expansion of the second layer.

* * * * *